(12) United States Patent
Vecera

(10) Patent No.: US 11,184,019 B1
(45) Date of Patent: Nov. 23, 2021

(54) ANALOG-TO-DIGITAL CONVERTER WITH SPLIT-GATE LADDERED-INVERTER QUANTIZER

(71) Applicant: INVENSENSE, INC., San Jose, CA (US)

(72) Inventor: Dusan Vecera, Stupava (SK)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 17/127,595

(22) Filed: Dec. 18, 2020

(51) Int. Cl.
  *H03M 3/00* (2006.01)
(52) U.S. Cl.
  CPC ........... *H03M 3/424* (2013.01); *H03M 3/462* (2013.01)
(58) Field of Classification Search
  CPC ........ H03M 3/424; H03M 3/462; H03M 1/12; H03M 3/30
  USPC .................................................. 341/143, 155
  See application file for complete search history.

(56) References Cited

U.S. PATENT DOCUMENTS

| | | | | |
|---|---|---|---|---|
| 9,948,318 | B1* | 4/2018 | Tsai | H03M 3/322 |
| 10,284,145 | B2* | 5/2019 | Sun | H03F 1/0211 |
| 2012/0194369 | A1* | 8/2012 | Galton | H03M 3/388 |
| | | | | 341/120 |
| 2015/0070202 | A1* | 3/2015 | Dedic | H03K 17/063 |
| | | | | 341/144 |

OTHER PUBLICATIONS

Alhawari, et al. "A 0.5 V 4 W CMOS Light-to-Digital Converter Based on a Nonuniform Quantizer for a Photoplethysmographic Heart-Rate Sensor" IEEE Journal of Solid-State Circuits, vol. 49, No. 1, Jan. 2014, 18 pages.
Tan, et al. "Decimation Filter—Multirate Digital Signal Processing, Oversampling of Analog-to-Digital Conversion, and Undersampling of Bandpass Signals" Digital Signal Processing (Second Edition), 2013, [https://www.sciencedirect.com/topics/engineering/decimation-filter], 25 pages.
Baker, Bonnie. "How delta-sigma ADCs work, Part 1" Analog Applications Journal, 3Q, 2011, 6 pages.

* cited by examiner

*Primary Examiner* — Jean B Jeanglaude
(74) *Attorney, Agent, or Firm* — Amin, Turocy & Watson, LLP

(57) ABSTRACT

An analog-to-digital converter (ADC) with split-gate laddered-inverter quantizer is presented herein. The ADC converts, via the split-gate laddered-inverter quantizer, an analog input voltage into a digital output value. The split-gate laddered-inverter quantizer separately couples, during respective phases of a clock signal via respective capacitances, a reference voltage and an input voltage corresponding to the analog input voltage to P-type metal-oxide-semiconductor (PMOS) gates of a PMOS branch of the split-gate laddered-inverter quantizer and N-type metal-oxide-semiconductor (NMOS) gates of an NMOS branch of the split-gate laddered-inverter quantizer to optimize current flow at respective frequencies. Further, the split-gate laddered-inverter quantizer separately biases, during the respective phases of the clock signal, the NMOS gates and the PMOS gates at respective bias voltages to optimize the current flow at the respective frequencies.

20 Claims, 14 Drawing Sheets

1000

3-bit slit-gate laddered-inverter quantizer with ~23.5 mV quantizer step voltage

1100

1300

~3μA/comparator
@3MHz sampling
frequency

| FLASH ADC QUANTIZER | 3-BIT (8-LEVEL) | 4-BIT (16-LEVEL) |
|---|---|---|
| CURRENT (@3 MHz SAMPLING FREQUENCY) | ~21 μA | ~45 μA |

US 11,184,019 B1

ANALOG-TO-DIGITAL CONVERTER WITH SPLIT-GATE LADDERED-INVERTER QUANTIZER

TECHNICAL FIELD

The subject disclosure generally relates to embodiments for an analog-to-digital converter (ADC) with split-gate laddered-inverter quantizer.

BACKGROUND

A key building block of many devices, e.g., sensor devices (e.g., micro-electro-mechanical system (MEMS) based sensor devices) is the ADC. Unfortunately, conventional ADCs consume a significant portion of an overall power budget of a corresponding application-specific integrated circuit (ASIC). For example, one of the main power contributors of a conventional ADC is a quantizer circuit, which can be implemented using a simple flash ADC (see, e.g., FIG. 13) that requires $2^m-1$ comparators for an m-bit quantizer, e.g., a 3-bit quantizer requiring 7 comparators, a 4-bit quantizer requiring 15 comparators, and so on. In this regard, the flash ADC quantizer illustrated by FIG. 13 consumes approximately 3 microamperes (µA) per comparator when sampled at a frequency of approximately 3 megahertz (MHz).

Although conventional ADC technologies can utilize a non-uniform quantizer implemented as a laddered-inverter quantizer/amplifier/filter (LIQAF), (see, e.g., FIG. 14 and "A 0.5V<4µW CMOS photoplethysmographic heart-rate sensor IC based on a non-uniform quantizer", *IEEE Int. Solid-State Circuits Conf. Dig. Tech. Paper*, February 2013, pp. 384-385), such non-uniform quantizers have slow settling speeds, e.g., preventing sampling rates over 5 MHz. In addition, conventional quantizer's consume excessive power because of their large variation in current consumption over process, voltage, and temperature (PVT) changes. In this regard, conventional integrated circuit (IC) technologies have had some drawbacks, some of which may be noted with reference to the various embodiments described herein below.

BRIEF DESCRIPTION OF THE DRAWINGS

Non-limiting embodiments of the subject disclosure are described with reference to the following Figures, wherein like reference numerals refer to like parts throughout the various views unless otherwise specified.

DETAILED DESCRIPTION

Figure 1:
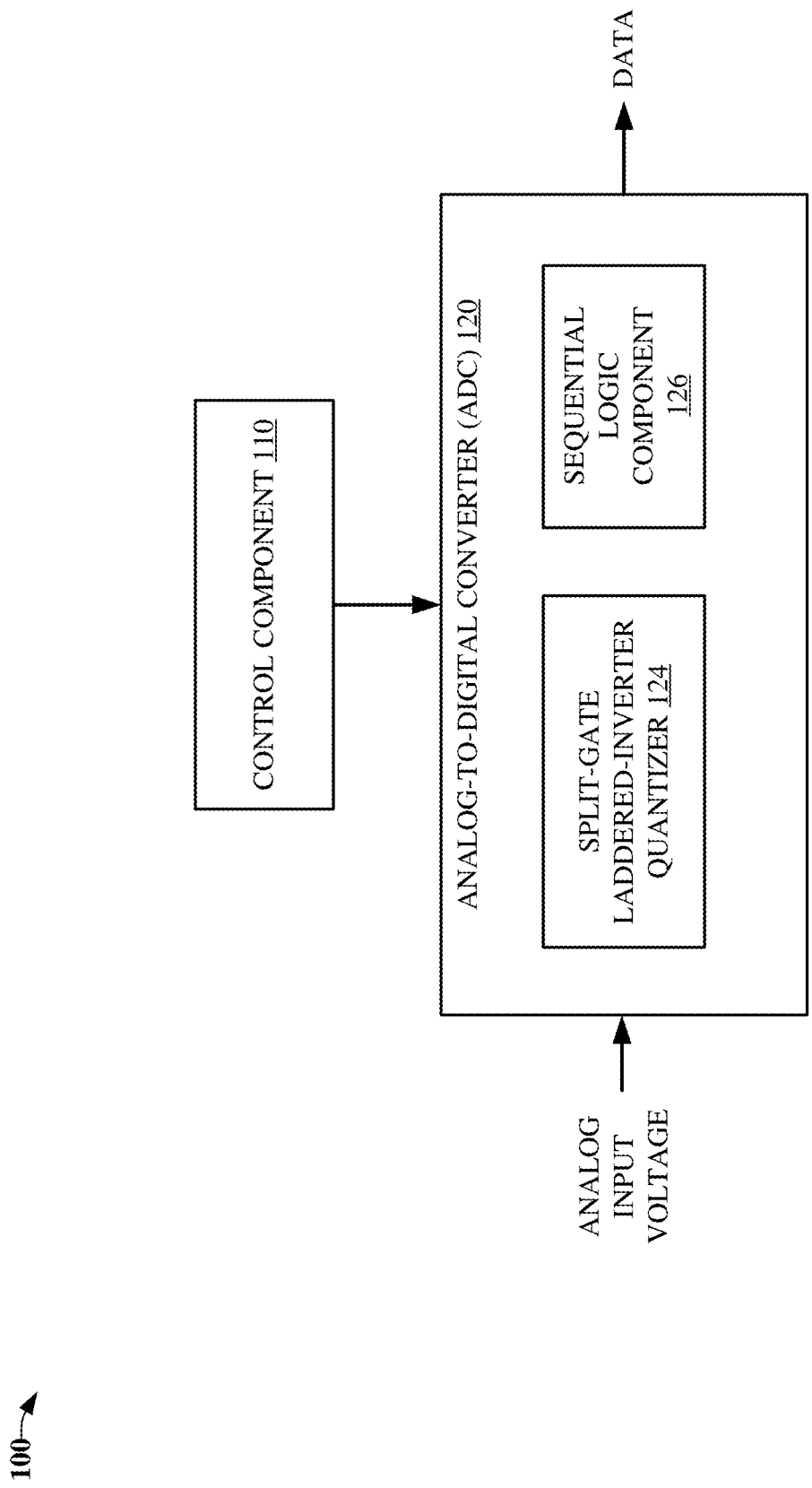
FIG. 1 illustrates a block diagram of a circuit comprising an ADC that comprises a split-gate laddered-inverter quantizer, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, conventional ADCs consume significant portions of corresponding integrated circuit (IC) overall power budgets, e.g., especially in multi-bit implementations. Further, conventional quantizers used in ADCs have slow settling speeds and consume excessive power, e.g., due to respective PVT changes.

On the other hand, various embodiments disclosed herein can significantly reduce, e.g., by a factor of 10 or more, quantizer current consumption by utilizing a split-gate laddered-inverter quantizer. In this regard, an analog input of the split-gate laddered-inverter quantizer and a reference voltage of the laddered-inverter quantizer are separately coupled, during respective phases of a clock signal via respective capacitances, to P-type metal-oxide-semiconductor (PMOS) gates of a PMOS branch of the split-gate laddered-inverter quantizer and N-type metal-oxide-semiconductor (NMOS) gates of an NMOS branch of the split-gate laddered-inverter quantizer, while the PMOS gates and the NMOS gates are separately biased, during the respective phases of the clock signal, at respective bias voltages. In this regard, various embodiments of the split-gate laddered-inverter quantizer disclosed herein can reduce quantizer power consumption over conventional IC technologies by applying gate-to-source (Vgs) voltages that are independent of a corresponding voltage supply (Vdd). Further, such embodiments can enable adjustment of bias current, e.g., to control settling speed of the split-gate laddered-inverter quantizer at defined operating frequencies, independently from PVT variations corresponding to such quantizer.

For example, in embodiment(s), a circuit, e.g., IC, comprises an ADC, e.g., direct-conversion ADC, flash ADC, $\Delta\Sigma$ ADC, or other ADC architecture that comprises a multi-bit quantizer, e.g., split-gate laddered-inverter quantizer—the multi-bit quantizer comprising a first decoupling capacitance, a second decoupling capacitance, a group of N-type metal-oxide-semiconductor (NMOS) transistors, and a group of P-type metal-oxide-semiconductor (PMOS) transistors.

A first terminal of the first decoupling capacitance and a first terminal of the second decoupling capacitance are electrically connected to a reference voltage during a first portion of a clock period, and are electrically connected to an input voltage of the multi-bit quantizer during a second portion of the clock period.

The group of NMOS transistors have respective NMOS gates that are electrically connected to a second terminal of the first decoupling capacitance, in which an NMOS bias voltage is electrically connected to the respective NMOS gates during the first portion of the clock period, and in which the NMOS bias voltage is electrically disconnected from the respective NMOS gates during the second portion of the clock period.

The group PMOS transistors have respective PMOS gates that are electrically connected to a second terminal of the second decoupling capacitance, in which a PMOS bias voltage is electrically connected to the respective PMOS gates during the first portion of the clock period, and in which the PMOS bias voltage is electrically disconnected from the respective PMOS gates during the second portion of the clock period.

In turn, the ADC generates, via the multi-bit quantizer, a digital output value representing the input voltage of the multi-bit quantizer—the input voltage of the multi-bit quantizer corresponding to an analog input voltage of the ADC.

In embodiment(s), the group of NMOS transistors are an NMOS transistor chain in which the NMOS transistors are connected in series, the group of PMOS transistors are a PMOS transistor chain in which the PMOS transistors are connected in series, and respective NMOS transistors of the NMOS transistor chain are connected in parallel with respective PMOS transistors of the PMOS transistor chain.

In other embodiment(s), respective NMOS drains of the respective NMOS transistors and respective NMOS sources of the respective NMOS transistors, and respective PMOS drains of the respective PMOS transistors and respective PMOS sources of the respective PMOS transistors are electrically connected to respective outputs of the multi-bit quantizer.

In yet other embodiment(s), the ADC further comprises a sequential logic component comprising data flip-flops, in which the respective outputs of the multi-bit quantizer are electrically connected to respective inputs of the data flip-flops, and in which outputs of the data flip-flops comprise data representing the input voltage of the multi-bit quantizer.

In embodiment(s), the ADC comprises a $\Delta\Sigma$ ADC comprising a digital decimation filter that removes outband quantization noise from the data to obtain a digital output value representing the input voltage of the multi-bit quantizer.

In other embodiment(s), the circuit further comprises a sensor, e.g., an electromechanical sensor, MEMS based sensor, or other sensing device that outputs an output voltage, e.g., the analog input voltage of the ADC, based on an excitation, e.g., via a force, a fluid, a sound pressure, a magnetic and/or electrical field, a gravity, a movement, or other excitation of the sensor, e.g., via an amplifier of the circuit and/or sensor.

In yet other embodiment(s), the sensor comprises an accelerometer, a gyroscope, an acoustic sensor, a microphone, a pressure sensor, or a magnetometer.

In embodiment(s), a method comprises: electrically connecting a first terminal of a first capacitance of a multi-bit quantizer of an analog-to-digital converter (ADC) (e.g., direct-conversion ADC, flash ADC, $\Delta\Sigma$ ADC, or other ADC architecture) to NMOS gates of a group of NMOS transistors of the multi-bit quantizer, and electrically connecting a first terminal of a second capacitance of the multi-bit quantizer to PMOS gates of a group of PMOS transistors of the multi-bit quantizer, in which the ADC generates, based on a clock input via the multi-bit quantizer, a digital output based on an analog input voltage of the ADC.

In this regard, the NMOS transistors have been connected in series, the PMOS transistors have been connected in series, and respective NMOS transistors of the group of NMOS transistors are connected in parallel with respective PMOS transistors of the group of NMOS transistors.

Further, the method comprises: based on a first phase of the clock input, electrically connecting a second terminal of the first capacitance to a reference voltage and electrically connecting a second terminal of the second capacitance to the reference voltage, and electrically connecting an NMOS bias voltage to the NMOS gates and electrically connecting a PMOS bias voltage to the PMOS gates; and based on a second phase of the clock input, electrically disconnecting the second terminal of the first capacitance from the reference voltage and electrically connecting the second terminal of the first capacitance to an input voltage of the multi-bit quantizer corresponding to the analog input voltage of the ADC, electrically disconnecting the second terminal of the second capacitance from the reference voltage and electrically connecting the second terminal of the second capacitance to the input voltage corresponding to the analog input voltage, and electrically disconnecting the NMOS bias voltage from the NMOS gates and electrically disconnecting the PMOS bias voltage from the PMOS gates.

In embodiment(s), the method further comprises electrically connecting respective outputs of the multi-bit quantizer to respective NMOS drains of the respective NMOS transistors, respective NMOS sources of the respective NMOS transistors, respective PMOS drains of the respective PMOS, and respective PMOS sources of the respective PMOS transistors.

In other embodiment(s), the method further comprises electrically connecting the respective outputs of the multi-bit quantizer to inputs of data flip-flops of the ADC, in which outputs of the data flip-flops comprise data representing the input voltage of the multi-bit quantizer corresponding to the analog input voltage of the ADC.

In yet other embodiment(s), the ADC comprises a $\Delta\Sigma$ ADC, and the method further comprises removing outband quantization noise from the data to obtain the digital output.

In embodiment(s), the method further comprises generating, via an electromechanical sensor, the analog input voltage. In this regard, in other embodiment(s), the generating of the analog input voltage comprises generating, via an accelerometer, a gyroscope, an acoustic sensor, a microphone, a pressure sensor, or a magnetometer, the analog input voltage.

In other embodiment(s), a circuit, e.g., an IC, comprises: an ADC (e.g., direct-conversion ADC, flash ADC, ΔΣ ADC, or other ADC architecture) that converts, via a split-gate laddered-inverter quantizer, an analog input voltage into a digital output value, in which the split-gate laddered-inverter quantizer separately couples, during respective phases of a clock signal via respective capacitances, a reference voltage and an input voltage of the split-gate laddered-inverter quantizer corresponding to the analog input voltage to PMOS gates of a PMOS branch of the split-gate laddered-inverter quantizer and NMOS gates of an NMOS branch of the split-gate laddered-inverter quantizer to optimize current flow of the IC at respective frequencies. Further, the split-gate laddered-inverter quantizer separately biases, during the respective phases of the clock signal, the NMOS gates and the PMOS gates at respective bias voltages to optimize the current flow of the IC at the respective frequencies.

In yet other embodiment(s), PMOS transistors of the PMOS branch are connected in series, NMOS transistors of the NMOS branch are connected in series, and respective PMOS transistors of the PMOS branch are connected in parallel with respective NMOS transistors of the NMOS branch.

In embodiment(s), respective PMOS sources of the respective PMOS transistors and respective PMOS drains of the respective PMOS transistors, and respective NMOS sources of the respective NMOS transistors and respective NMOS drains of the respective NMOS transistors are electrically connected to respective outputs of the split-gate laddered-inverter quantizer.

In other embodiment(s), the ADC comprises a sequential logic component that comprises data flip-flops, in which the respective outputs of the split-gate laddered-inverter quantizer are connected to inputs of the data flip-flops, and in which outputs of the data flip-flops comprise data representing the input voltage of the split-gate laddered-inverter quantizer corresponding to the analog input voltage.

In yet other embodiment(s), the ADC is a ΔΣ ADC that further comprises a digital decimation filter that generates the digital output value by removing outband quantization noise from the data.

In other embodiment(s), the IC further comprises a control component that generates the reference voltage, generates the respective bias voltages, generates the clock signal, separately couples, via the respective capacitances during the respective phases using respective control signals, the reference voltage and the input voltage to the PMOS gates and the NMOS gates, and separately applies, during the respective phases using the respective control signals, the respective bias voltages to the PMOS gates and the NMOS gates.

In yet other embodiment(s), the IC further comprises a sensor, e.g., MEMS sensor, comprising an accelerometer, a gyroscope, an acoustic sensor, a microphone, a pressure sensor, a magnetometer, or other sensing device that outputs an output voltage based on an excitation, e.g., via a force, a fluid, a sound pressure, a magnetic and/or electrical field, a gravity, a movement, or other excitation of the sensor.

In various embodiments disclosed herein, a split-gate laddered-inverter quantizer can significantly reduce quantizer current consumption, and improve corresponding ADC settling speeds by applying gate-to-source (Vgs) voltages that are independent of a corresponding voltage supply (Vdd) of the quantizer. Further, such embodiments can reduce excessive current consumption due to PVT variation(s) by enabling adjustment of bias current of the split-gate laddered-inverter quantizer, e.g., to control settling speed independently from PVT variations affecting the quantizer.

In this regard, and now referring to FIGS. 1 and 2 and FIGS. 5 and 6, block diagrams of circuits (100, 200) comprising an ADC (120) (e.g., direct-conversion ADC, flash ADC, ΔΣ ADC, or other ADC architecture) that generates, via a split-gate laddered-inverter quantizer (124) (e.g., multi-bit quantizer), a digital output value (DATA) representing an input voltage of the multi-bit quantizer corresponding to an analog input voltage of the ADC; and block diagrams of a circuit (400) comprising an n-bit split-gate laddered-inverter quantizer and a circuit (500) comprising a 2-bit split-gate laddered-inverter quantizer are illustrated, respectively, in accordance with various example embodiments.

The split-gate laddered-inverter quantizer is a multi-bit (e.g., 2-bit, n-bit) quantizer comprising a first decoupling capacitance ($C_{CN}/C_{CP}$), a second decoupling CAPACITANCE ($C_{CP}/C_{CN}$), A GROUP (510) OF N-TYPE METAL-OXIDE-SEMICONDUCTOR (NMOS) transistors, and a group (520) of P-type metal-oxide-semiconductor (PMOS) transistors.

Figure 3:
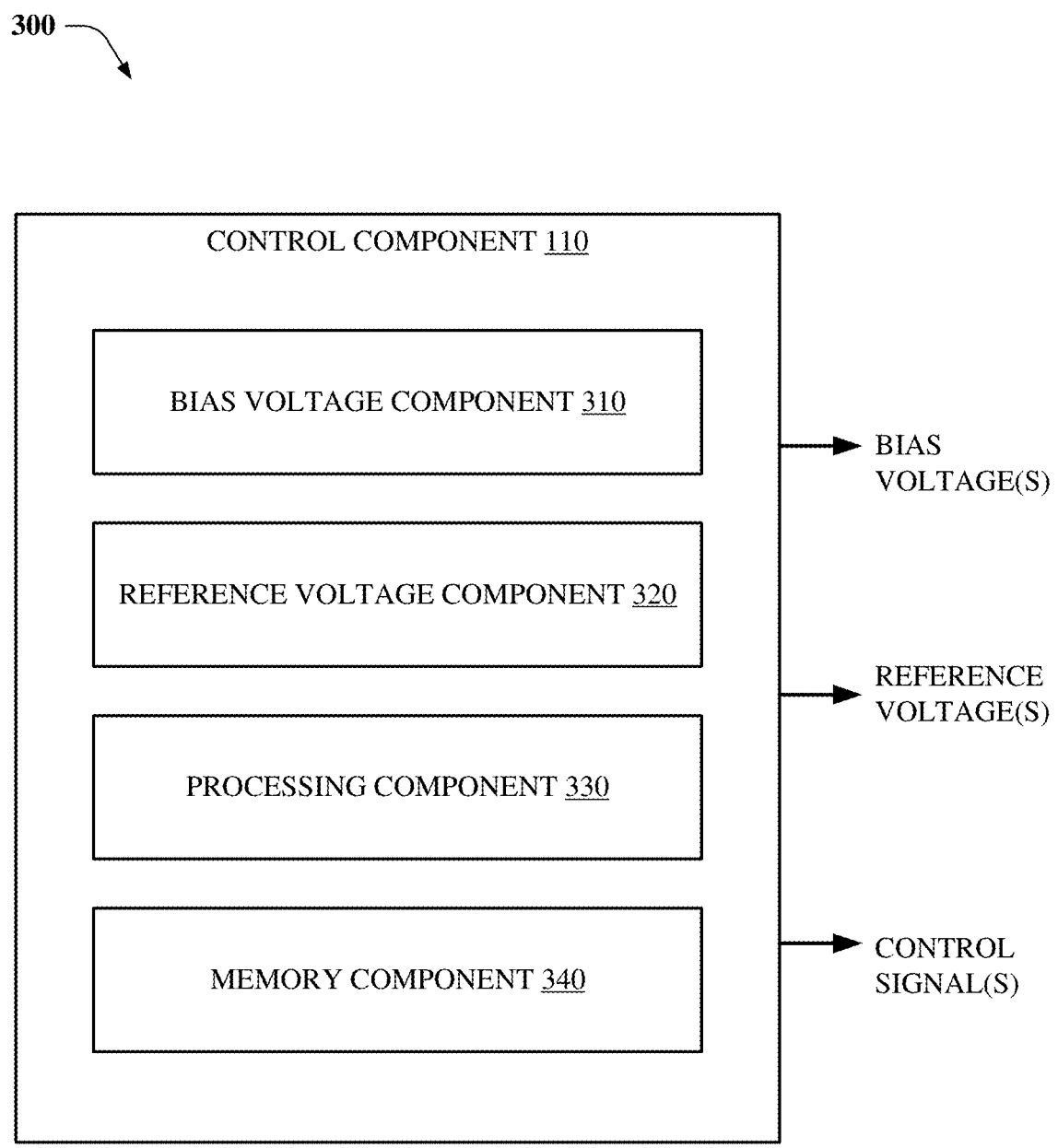
FIG. 3 illustrates a block diagram of a control component for controlling a split-gate laddered-inverter quantizer, in accordance with various example embodiments.
Figure 4:
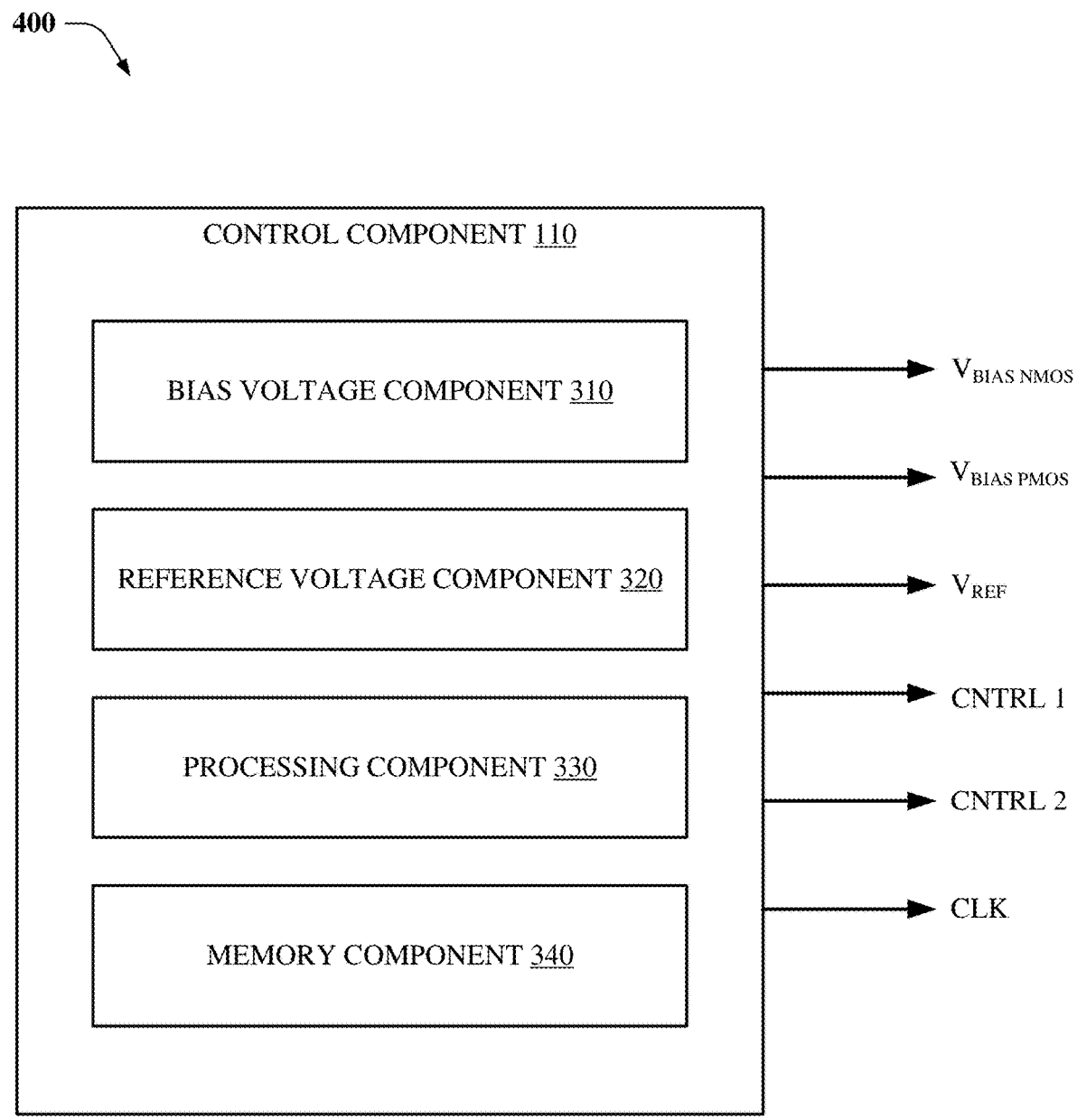
FIG. 4 illustrates a block diagram of another control component for controlling a split-gate laddered-inverter quantizer, in accordance with various example embodiments.
Figure 5:
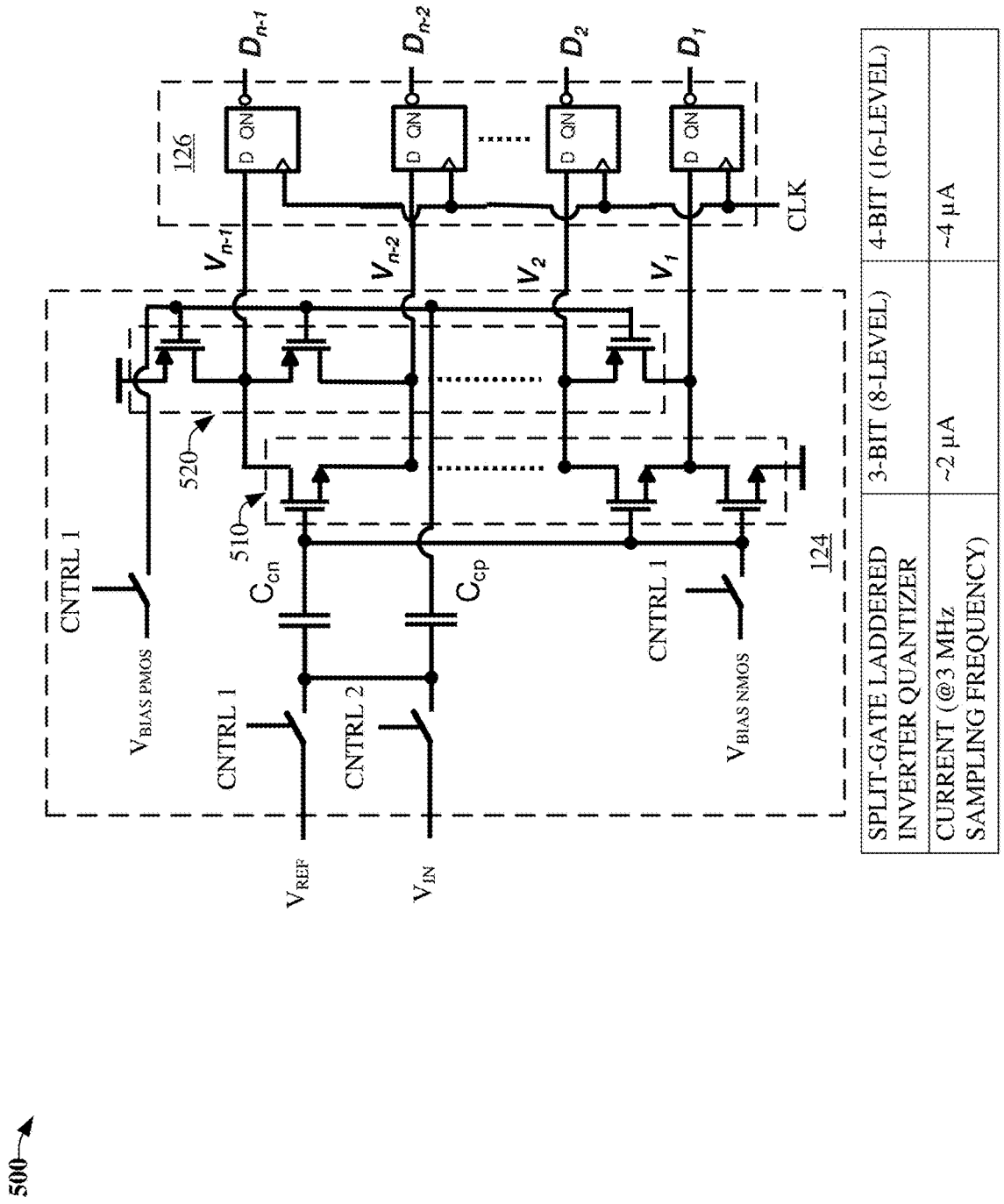
FIG. 5 illustrates a block diagram of an n-bit split-gate laddered-inverter quantizer, in accordance with various example embodiments.
Figure 6:
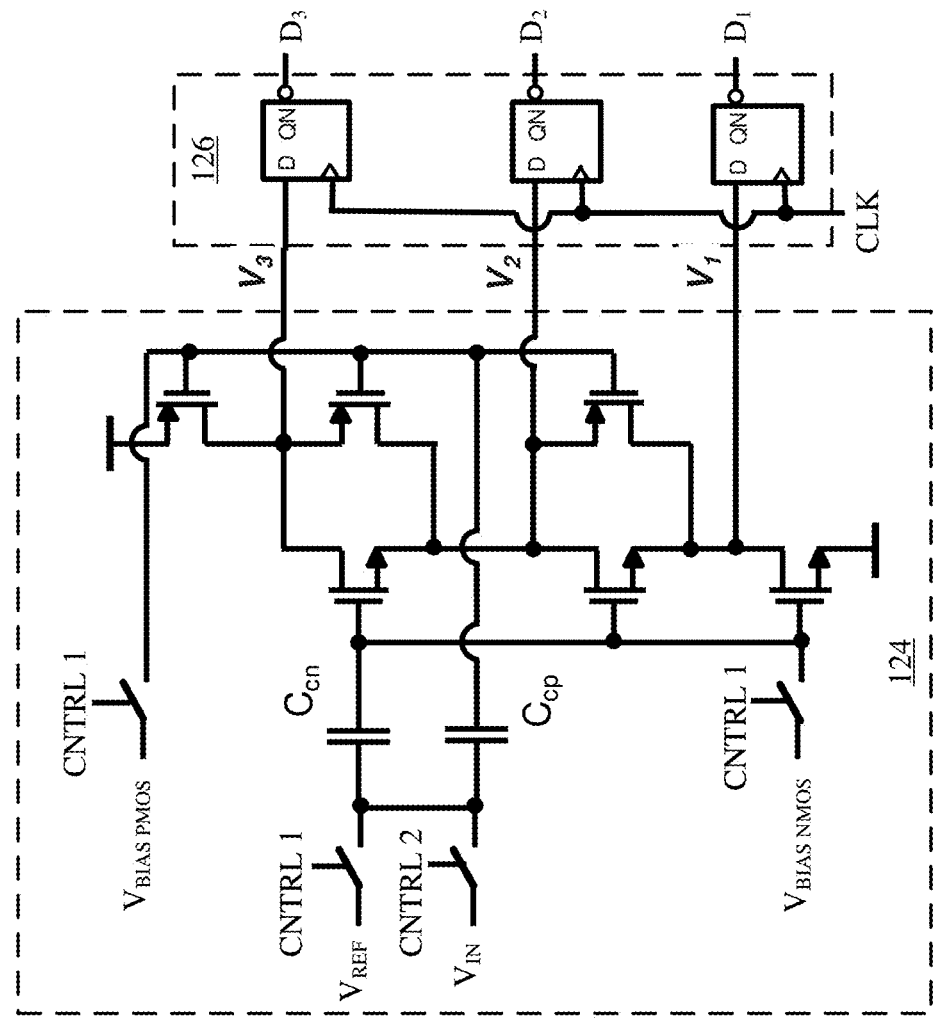
FIG. 6 illustrates a block diagram of a 2-bit (4 output combination) split-gate laddered-inverter quantizer, in accordance with various example embodiments.

As illustrated by FIGS. 3 and 4, a control component (110), which is electrically coupled to the ADC, comprises a bias voltage component (310) that generates bias voltage(s) for the ADC, a reference voltage component (320) that generates references voltage(s) for the ADC, a processing component (330), and a memory component (340)—the processing component performing, e.g., via the memory component, operations for controlling application of the bias voltage(s), the reference voltage(s), and control signal(s) (e.g., CNTRL 1, CNTRL 2, and CLK) to the ADC, e.g., for sampling the input voltage of the multi-bit quantizer.

In this regard, the control component electrically connects, via a portion of the control signal(s) (e.g., via CNTRL 1 and CNTRL 2) that are electronically connected to respective electronic switches, transmission gates, analog gates, or similar voltage switching mechanisms, a reference voltage ($V_{REF}$) of the reference voltage(s) to a first terminal of the first decoupling capacitance and to a first terminal of the second decoupling capacitance during a first portion, e.g. first phase, of a clock period of a clock signal (CLK) of the control signal(s).

During a second portion, e.g., second phase, of the clock period, the control component electrically connects, via the portion of the control signal(s), an input voltage ($Y_{IN}$) of the multi-bit quantizer to the first terminal of the first decoupling capacitance and to the first terminal of the second decoupling capacitance.

It should be appreciated that during the first portion of the clock period, the control component electronically disconnects, via the portion of the control signal(s), the input voltage from respective first terminals of the first decoupling capacitance and the second decoupling capacitance. Further, during the second portion of the clock period, the control component electronically disconnects, via the portion of the control signal(s), the reference voltage from the respective first terminals of the first decoupling capacitance and the second decoupling capacitance.

Respective second terminals of the first decoupling capacitance and the second decoupling capacitance are electrically connected to respective NMOS gates of the group of NMOS transistors and respective PMOS gates of the group of PMOS transistors. In turn, during the first portion of the clock period, the control component electrically connects, via the portion(s) of the control signal(s) using respective electronic switches, transmission gates, analog gates, or similar voltage switching mechanisms, an NMOS bias voltage ($V_{BIAS\_NMOS}$) of the bias voltage(s) to the respective NMOS gates and a PMOS bias voltage ($V_{BIAS\_PMOS}$) of the bias voltage(s) to the respective PMOS gates.

During the second portion of the clock period, the control component electrically disconnects, via the portion(s) of the control signal(s), the NMOS bias voltage from the respective NMOS gates and the PMOS bias voltage from the respective PMOS gates.

In embodiment(s), the group of NMOS transistors are an NMOS transistor chain in which the NMOS transistors are connected in series, the group of PMOS transistors are a PMOS transistor chain in which the PMOS transistors are connected in series, and respective NMOS transistors of the NMOS transistor chain are connected in parallel with respective PMOS transistors of the PMOS transistor chain.

Further, respective NMOS drains of the respective NMOS transistors and respective NMOS sources of the respective NMOS transistors, and respective PMOS drains of the respective PMOS transistors and respective PMOS sources of the respective PMOS transistors are electrically connected to respective outputs (e.g., $V_1$, $V_2$, $V_3$, $V_{n-2}$, $V_{n-1}$) of the multi-bit quantizer.

Figure 2:
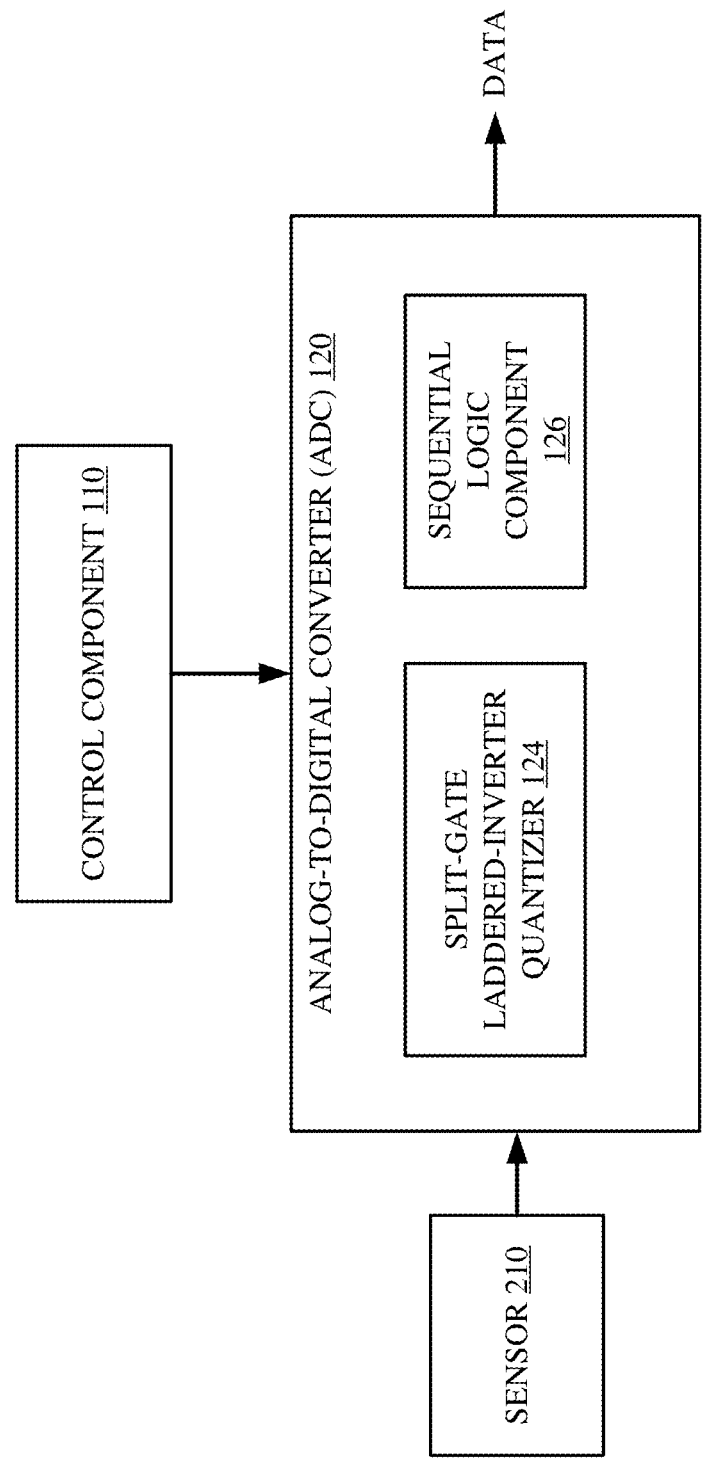
FIG. 2 illustrates a block diagram of a sensor-based circuit utilizing a sensor that is electronically coupled to an ADC comprising a split-gate laddered-inverter quantizer, in accordance with various example embodiments.

As illustrated by FIGS. 1 and 2, the ADC further comprises a sequential logic component (126) comprising data flip-flops, in which the respective outputs of the multi-bit quantizer are electrically connected to respective inputs of the data flip-flops. The clock signal (CLK) of the control signal(s) is electronically coupled to respective clock inputs of the data flip-flops, and based on a transition, e.g., rising/falling edge, of the clock signal, the data flip-flops receive the outputs of the multi-bit quantizer. In turn, such outputs are reflected, e.g., after a falling/rising edge of the clock signal, in the outputs (e.g., $D_1$, $D_2$, $D_3$, $D_{n-2}$, $D_{n-1}$) of the data flip-flops, e.g., for sampling by the control component. In this regard, the outputs of the data flip-flops represent the input voltage of the multi-bit quantizer e.g., corresponding to the analog input voltage of the ADC.

As illustrated by FIG. 2, in embodiment(s), the circuit can comprise a sensor (210), e.g., an electromechanical sensor, MEMS-based sensor, or other sensing device that outputs an output voltage, e.g., the analog input voltage of the ADC, based on an excitation, e.g., via a force, a fluid, a sound pressure, a magnetic and/or electrical field, a gravity, a movement, or other excitation of the sensor, e.g., via an amplifier (not shown) of the circuit and/or the sensor. In other embodiment(s), the sensor comprises an accelerometer, a gyroscope, an acoustic sensor, a microphone, a pressure sensor, or a magnetometer.

Figure 7:
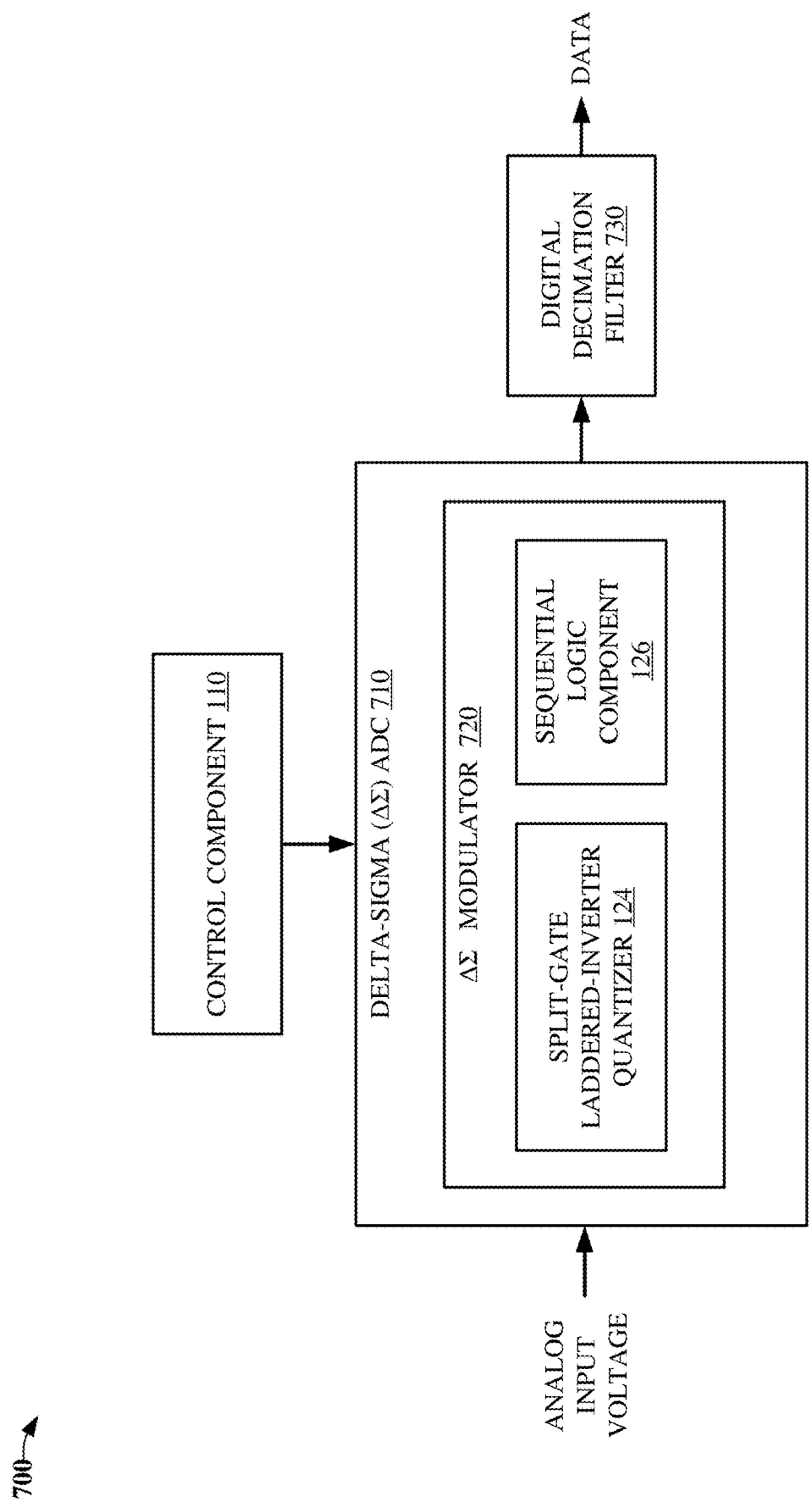
FIG. 7 illustrates a block diagram of a circuit comprising a delta-sigma (ΔΣ) ADC that comprises a split-gate laddered-inverter quantizer, in accordance with various example embodiments.
Figure 8:
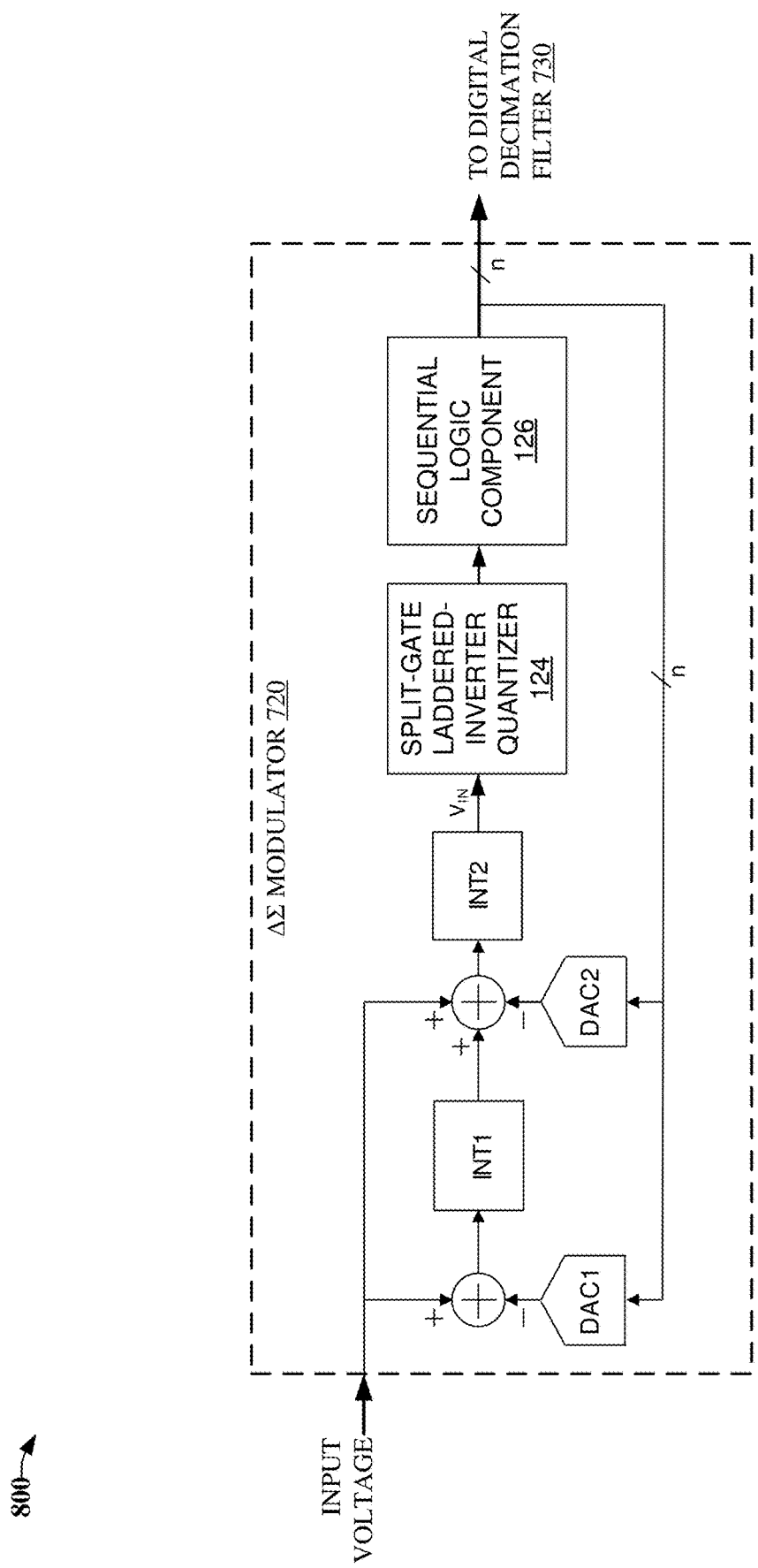
FIG. 8 illustrates a block diagram of a ΔΣ modulator utilizing a split-gate laddered-inverter quantizer, in accordance with various example embodiments.

Referring now to FIGS. 7 and 8, block diagrams of a circuit (700) comprising a ΔΣ ADC (710) and a ΔΣ modulator (720) of the ΔΣ ADC are illustrated, respectively, in accordance with various example embodiments. The ΔΣ modulator comprises the multi-bit quantizer (124) and the sequential logic component (126). In this regard, a data output of the sequential logic component represents an input voltage of the multi-bit quantizer, e.g., corresponding to an analog input voltage of the ΔΣ modulator. Further, a digital decimation filter (730) of the circuit receives the data output of the sequential logic component and removes outband quantization noise from the data output to obtain a digital output value representing the analog input voltage of the ΔΣ modulator, e.g., representing an analog input voltage of the ΔΣ ADC.

Figure 9:
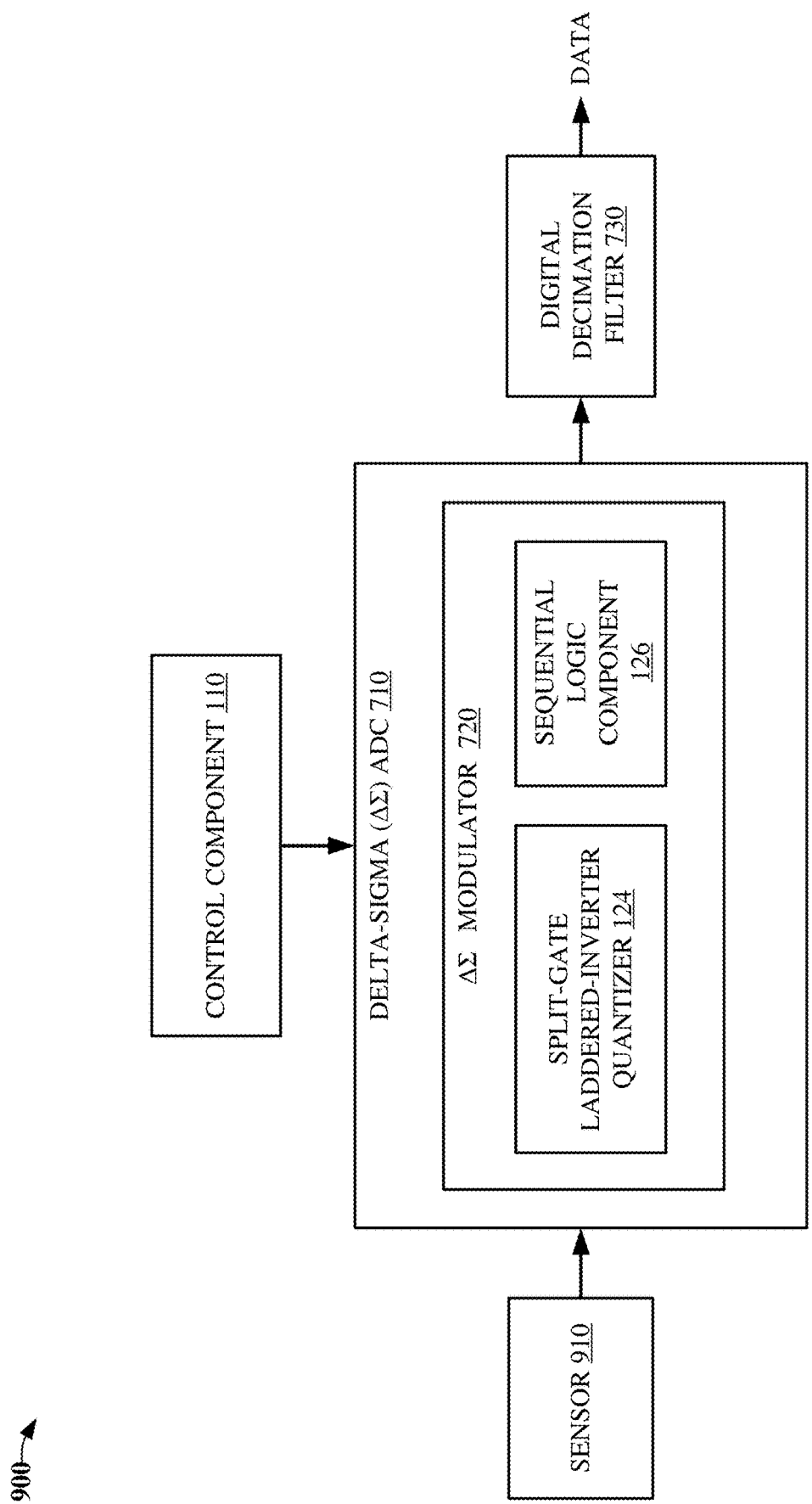
FIG. 9 illustrates a block diagram of a sensor-based circuit utilizing a sensor that is electronically coupled to a ΔΣ ADC comprising a split-gate laddered-inverter quantizer, in accordance with various example embodiments.

FIG. 9 illustrates a block diagram of a sensor-based circuit (900) comprising a sensor (910) electronically coupled to a voltage input of a ΔΣ ADC (710) comprising a split-gate laddered-inverter quantizer (124), in accordance with various example embodiments. In this regard, in embodiment(s), the sensor comprises, e.g., an electromechanical sensor, a MEMS-based sensor, or other sensing device that outputs an output voltage based on an excitation, e.g., via a force, a fluid, a sound pressure, a magnetic and/or electrical field, a gravity, a movement, or other excitation of the sensor, e.g., via an amplifier (not shown) of the circuit and/or the sensor. In other embodiment(s), the sensor comprises an accelerometer, a gyroscope, an acoustic sensor, a microphone, a pressure sensor, or a magnetometer.

Figure 10:
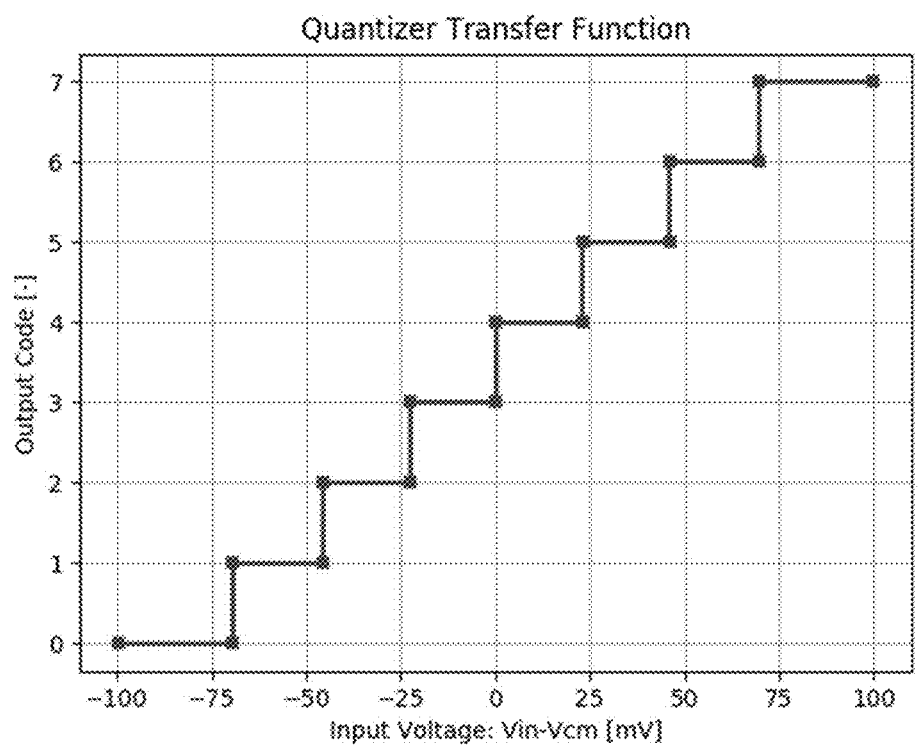
FIG. 10 illustrates a plot of a transfer function representing an output code of a split-gate laddered-inverter quantizer as a function of an input voltage of the split-gate laddered-inverter quantizer, in accordance with various example embodiments.
Figure 11:
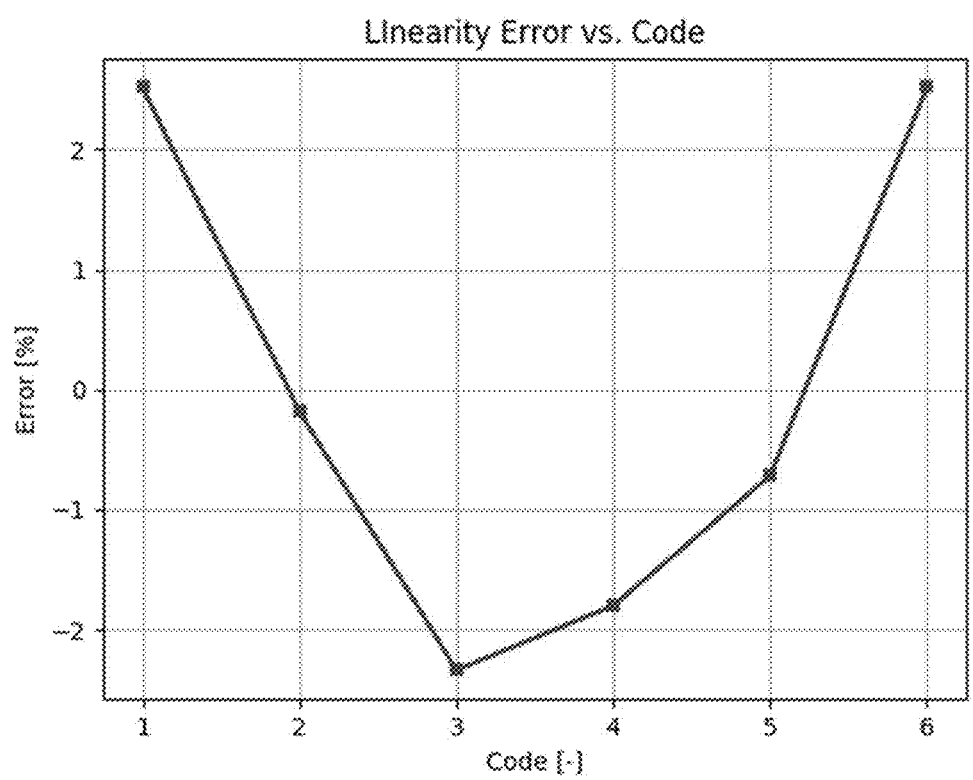
FIG. 11 illustrates a plot of a linearity error of a split-gate laddered-inverter quantizer as a function of a digital output code of the split-gate laddered-inverter quantizer, in accordance with various example embodiments.

Referring now to FIGS. 10 and 11, a plot (1000) of a transfer function representing a digital output code of a 3-bit split-gate laddered-inverter quantizer (124) as a function of an input voltage of the 3-bit split-gate laddered-inverter quantizer; and a plot (1100) of a linearity error of the split-gate laddered-inverter quantizer as a function of a digital output code of the split-gate laddered-inverter quantizer are illustrated, respectively, in accordance with various example embodiments. As illustrated by FIG. 10, the voltage step, or quantizer step, of the 3-bit split-gate laddered-inverter quantizer is approximately 23.5 millivolts (mV), e.g., per digital output code of the 3-bit split-gate laddered-inverter quantizer.

Figure 12:
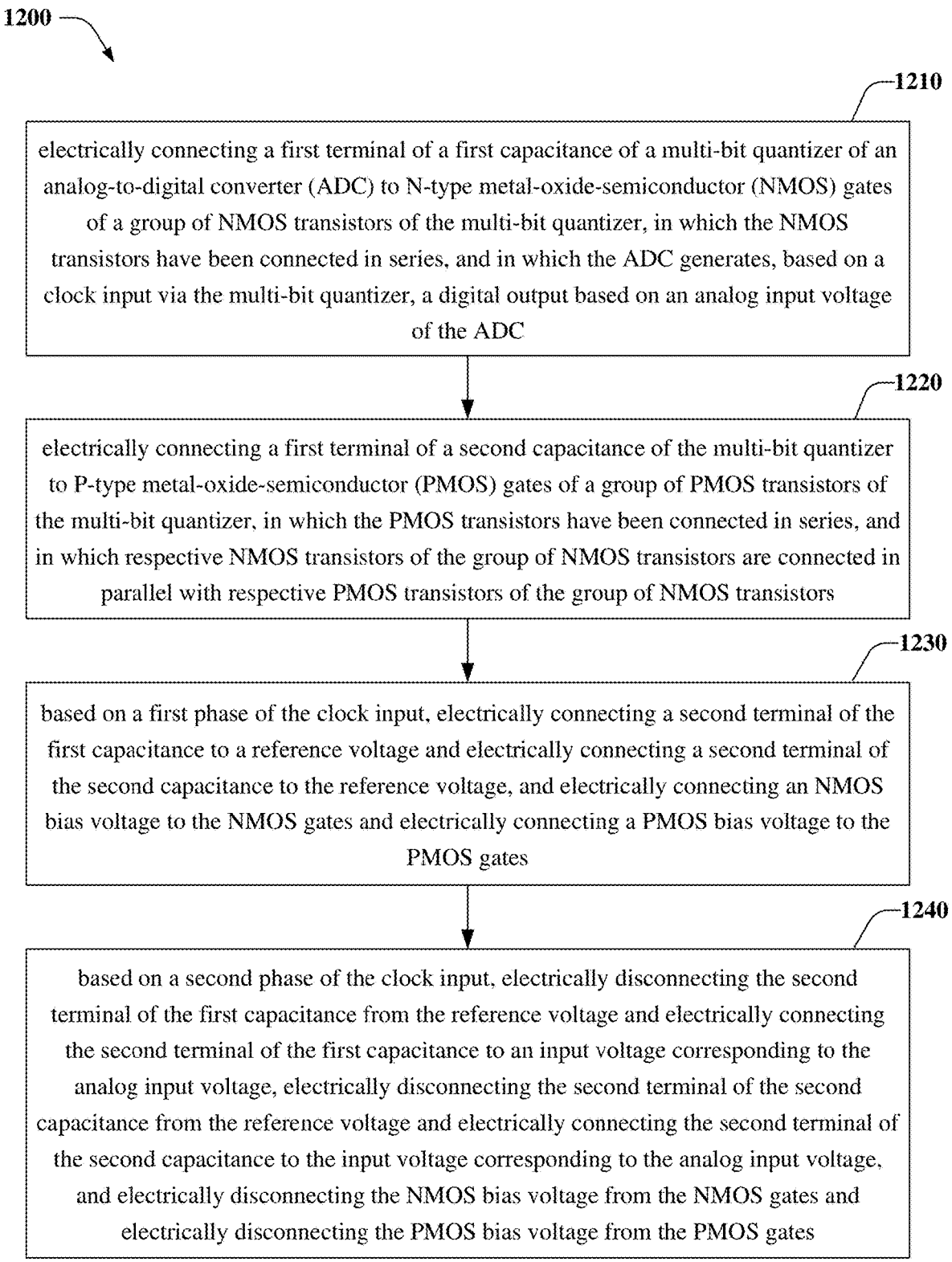
FIG. 12 illustrates a flowchart of a method associated with controlling a split-gate laddered-inverter quantizer, in accordance with various example embodiments.
Figure 13:
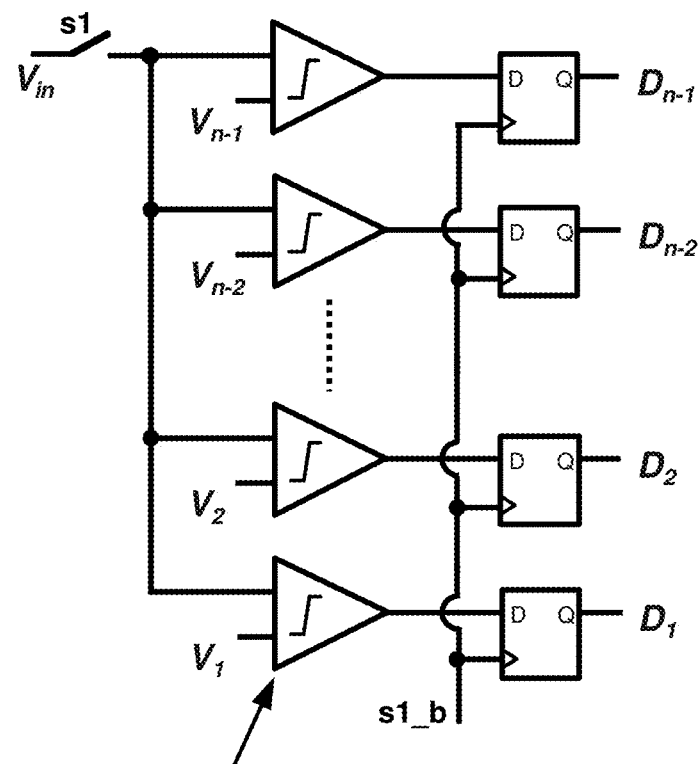
FIG. 13 illustrates a conventional flash ADC, in accordance with various example embodiments.
Figure 14:
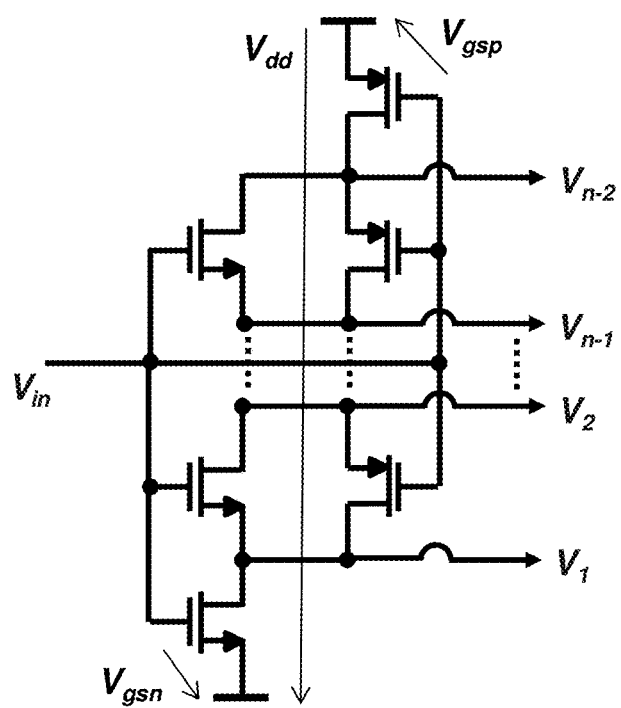
FIG. 14 illustrates a conventional quantizer, in accordance with various example embodiments.

FIG. 12 illustrates a methodology in accordance with the disclosed subject matter. For simplicity of explanation, the methodology is depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodology in accordance with the disclosed subject matter. In addition, those skilled in the art will understand and appreciate that the methodology could alternatively be represented as a series of interrelated states via a state diagram or events.

Referring again to FIG. 12, a flowchart (1200) of a method associated with controlling a multi-bit quantizer (e.g., split-gate laddered-inverter quantizer (124)) of an ADC is illustrated, in accordance with various example embodiments. At 1210, a control component (110) that is electronically coupled to the multi-bit quantizer electrically connects a first terminal of a first capacitance of the multi-bit quantizer to NMOS gates of a group of NMOS transistors of the multi-bit quantizer, in which the NMOS transistors have been connected in series, and in which the ADC generates, based on a clock input via the multi-bit quantizer, a digital output based on an analog input voltage of the ADC.

At 1220, the control component electrically connects a first terminal of a second capacitance of the multi-bit quantizer to PMOS gates of a group of PMOS transistors of the multi-bit quantizer, in which the PMOS transistors have been connected in series, and in which respective NMOS transistors of the group of NMOS transistors are connected in parallel with respective PMOS transistors of the group of NMOS transistors.

At 1230, the control component, based on a first phase of the clock input, electrically connects a second terminal of the first capacitance to a reference voltage and electrically connects a second terminal of the second capacitance to the reference voltage, and electrically connects an NMOS bias voltage to the NMOS gates and electrically connects a PMOS bias voltage to the PMOS gates.

At 1240, the control component, based on a second phase of the clock input, electrically disconnects the second terminal of the first capacitance from the reference voltage and electrically connects the second terminal of the first capacitance to an input voltage corresponding to the analog input voltage, electrically disconnects the second terminal of the second capacitance from the reference voltage and electrically connects the second terminal of the second capacitance to the input voltage corresponding to the analog input voltage, and electrically disconnects the NMOS bias voltage from the NMOS gates and electrically disconnects the PMOS bias voltage from the PMOS gates.

As it employed in the subject specification, the term "circuit" refers to substantially any analog and/or digital based device(s), circuit(s), etc. comprising, e.g., a resistor, a capacitor, a transistor, a diode, an inductor, a memory, a programmable device, e.g., fuse, field programmable gate array (FPGA), complex programmable logic device (CPLD), etc. relevant to performing operations and/or functions of circuit(s), device(s), system(s), etc. disclosed herein. Further, the terms "control component" and "processing component" can refer to substantially any computing processing unit or device (e.g., MAC, etc.), comprising, but not limited to comprising, a processor, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), an FPGA, a programmable logic controller (PLC), a CPLD, a discrete gate or transistor logic, discrete hardware components, an analog circuit, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

In the subject specification, the terms "memory", "memory component", and substantially any other information storage component relevant to operation and functionality of circuits (100, 200, 700, 900) and/or devices disclosed herein refer to "memory components," or entities embodied in a "memory," or components comprising the memory (e.g., 304). It will be appreciated that the memory can include volatile memory and/or nonvolatile memory. By way of illustration, and not limitation, volatile memory, can include random access memory (RAM), which can act as external cache memory. By way of illustration and not limitation, RAM can include synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM). In other embodiment(s) nonvolatile memory can include read only memory (ROM), programmable ROM (PROM), electrically programmable ROM (EPROM), electrically erasable ROM (EEPROM), or flash memory. Additionally, the components and/or devices disclosed herein can comprise, without being limited to comprising, these and any other suitable types of memory.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of circuits, devices, processes, and process blocks explained herein can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A circuit, comprising:
    an analog-to-digital converter (ADC) that comprises a multi-bit quantizer, the multi-bit quantizer comprising:
        a first decoupling capacitance, wherein a first terminal of the first decoupling capacitance is electrically connected to a reference voltage during a first portion of a clock period, and wherein the first terminal of the first decoupling capacitance is electrically connected to an input voltage of the multi-bit quantizer during a second portion of the clock period;

a second decoupling capacitance, wherein a first terminal of the second decoupling capacitance is electrically connected to the reference voltage during the first portion of the clock period, and wherein the first terminal of the second decoupling capacitance is electrically connected to the input voltage of the multi-bit quantizer during the second portion of the clock period;

a group of N-type metal-oxide-semiconductor (NMOS) transistors having respective NMOS gates that are electrically connected to a second terminal of the first decoupling capacitance, wherein an NMOS bias voltage is electrically connected to the respective NMOS gates during the first portion of the clock period, and wherein the NMOS bias voltage is electrically disconnected from the respective NMOS gates during the second portion of the clock period; and a group of P-type metal-oxide-semiconductor (PMOS) transistors having respective PMOS gates that are electrically connected to a second terminal of the second decoupling capacitance, wherein a PMOS bias voltage is electrically connected to the respective PMOS gates during the first portion of the clock period, wherein the PMOS bias voltage is electrically disconnected from the respective PMOS gates during the second portion of the clock period, wherein the ADC generates, via the multi-bit quantizer, a digital output value representing an analog input voltage of the ADC, and wherein the input voltage of the multi-bit quantizer corresponds to the analog input voltage of the ADC.

2. The circuit of claim 1, wherein the group of NMOS transistors are an NMOS transistor chain in which the NMOS transistors are connected in series, wherein the group of PMOS transistors are a PMOS transistor chain in which the PMOS transistors are connected in series, and wherein respective NMOS transistors of the NMOS transistor chain are connected in parallel with respective PMOS transistors of the PMOS transistor chain.

3. The circuit of claim 2, wherein respective NMOS drains of the respective NMOS transistors and respective NMOS sources of the respective NMOS transistors, and respective PMOS drains of the respective PMOS transistors and respective PMOS sources of the respective PMOS transistors, are electrically connected to respective outputs of the multi-bit quantizer.

4. The circuit of claim 3, wherein the ADC further comprises:

a sequential logic component comprising data flip-flops, wherein the respective outputs of the multi-bit quantizer are electrically connected to respective inputs of the data flip-flops, and wherein outputs of the data flip-flops comprise data representing the input voltage of the multi-bit quantizer.

5. The circuit of claim 4, wherein the ADC comprises a delta-sigma ADC, and further comprising:

a digital decimation filter that removes outband quantization noise from the data to obtain a digital output value representing the input voltage of the multi-bit quantizer.

6. The circuit of claim 1, further comprising:

an electromechanical sensor that generates, via an amplifier of the circuit, the analog input voltage of the ADC.

7. The circuit of claim 6, wherein the electromechanical sensor comprises:

an accelerometer, a gyroscope, an acoustic sensor, a microphone, a pressure sensor, or a magnetometer.

8. A method, comprising:

electrically connecting a first terminal of a first capacitance of a multi-bit quantizer of an analog-to-digital converter (ADC) to N-type metal-oxide-semiconductor (NMOS) gates of a group of NMOS transistors of the multi-bit quantizer, wherein the NMOS transistors have been connected in series, and wherein the ADC generates, based on a clock input via the multi-bit quantizer, a digital output based on an analog input voltage of the ADC;

electrically connecting a first terminal of a second capacitance of the multi-bit quantizer to P-type metal-oxide-semiconductor (PMOS) gates of a group of PMOS transistors of the multi-bit quantizer, wherein the PMOS transistors have been connected in series, and wherein respective NMOS transistors of the group of NMOS transistors are connected in parallel with respective PMOS transistors of the group of NMOS transistors;

based on a first phase of the clock input,
electrically connecting a second terminal of the first capacitance to a reference voltage and electrically connecting a second terminal of the second capacitance to the reference voltage, and
electrically connecting an NMOS bias voltage to the NMOS gates and electrically connecting a PMOS bias voltage to the PMOS gates; and based on a second phase of the clock input,
electrically disconnecting the second terminal of the first capacitance from the reference voltage and electrically connecting the second terminal of the first capacitance to an input voltage of the multi-bit quantizer corresponding to the analog input voltage of the ADC,
electrically disconnecting the second terminal of the second capacitance from the reference voltage and electrically connecting the second terminal of the second capacitance to the input voltage corresponding to the analog input voltage, and
electrically disconnecting the NMOS bias voltage from the NMOS gates and electrically disconnecting the PMOS bias voltage from the PMOS gates.

9. The method of claim 8, further comprising:

electrically connecting respective outputs of the multi-bit quantizer to respective NMOS drains of the respective NMOS transistors, respective NMOS sources of the respective NMOS transistors, respective PMOS drains of the respective PMOS, and respective PMOS sources of the respective PMOS transistors.

10. The method of claim 9, further comprising:

electrically connecting the respective outputs of the multi-bit quantizer to inputs of data flip-flops of the ADC, wherein outputs of the data flip-flops comprise data representing the input voltage of the multi-bit quantizer corresponding to the analog input voltage of the ADC.

11. The method of claim 10, wherein the ADC comprises a delta-sigma ADC, and further comprising:

removing outband quantization noise from the data to obtain the digital output.

12. The method of claim 8, further comprising:

generating, via an electromechanical sensor, the analog input voltage.

13. The method of claim 12, wherein the generating of the analog input voltage comprises:
  generating, via an accelerometer, a gyroscope, an acoustic sensor, a microphone, a pressure sensor, or a magnetometer, the analog input voltage.

14. An integrated circuit (IC) comprising:
  a control component that generates a clock signal, a reference voltage, and respective bias voltages; and
  an analog-to-digital converter (ADC) that converts, via a split-gate laddered-inverter quantizer, an analog input voltage into a digital output value, wherein the split-gate laddered-inverter quantizer separately couples, during respective phases of the clock signal via respective capacitances, the reference voltage and an input voltage corresponding to the analog input voltage to P-type metal-oxide-semiconductor (PMOS) gates of a PMOS branch of the split-gate laddered-inverter quantizer and N-type metal-oxide-semiconductor (NMOS) gates of an NMOS branch of the split-gate laddered-inverter quantizer to optimize current flow of the IC at respective frequencies, and wherein the split-gate laddered-inverter quantizer separately biases, during the respective phases of the clock signal, the NMOS gates and the PMOS gates at the respective bias voltages to optimize the current flow of the IC at the respective frequencies.

15. The IC of claim 14, wherein PMOS transistors of the PMOS branch are connected in series, wherein NMOS transistors of the NMOS branch are connected in series, and wherein respective PMOS transistors of the PMOS branch are connected in parallel with respective NMOS transistors of the NMOS branch.

16. The IC of claim 15, wherein respective PMOS sources of the respective PMOS transistors and respective PMOS drains of the respective PMOS transistors, and respective NMOS sources of the respective NMOS transistors and respective NMOS drains of the respective NMOS transistors are electrically connected to respective outputs of the split-gate laddered-inverter quantizer.

17. The IC of claim 14, wherein the ADC is a delta-sigma ADC.

18. The IC of claim 17, further comprising:
  a digital decimation filter that generates the digital output value by removing outband quantization noise from the data.

19. The IC of claim 14, further comprising:
  a control component that
    generates the reference voltage,
    generates the respective bias voltages,
    generates the clock signal,
    separately couples, via the respective capacitances during the respective phases using respective control signals, the reference voltage and the input voltage to the PMOS gates and the NMOS gates, and
    separately applies, during the respective phases using the respective control signals, the respective bias voltages to the PMOS gates and the NMOS gates.

20. The IC of claim 14, further comprising a micro-electro-mechanical system (MEMS) sensor comprising an accelerometer, a gyroscope, an acoustic sensor, a microphone, a pressure sensor, or a magnetometer, wherein the analog input voltage has been generated via the MEMS sensor.

* * * * *